Figure 1:
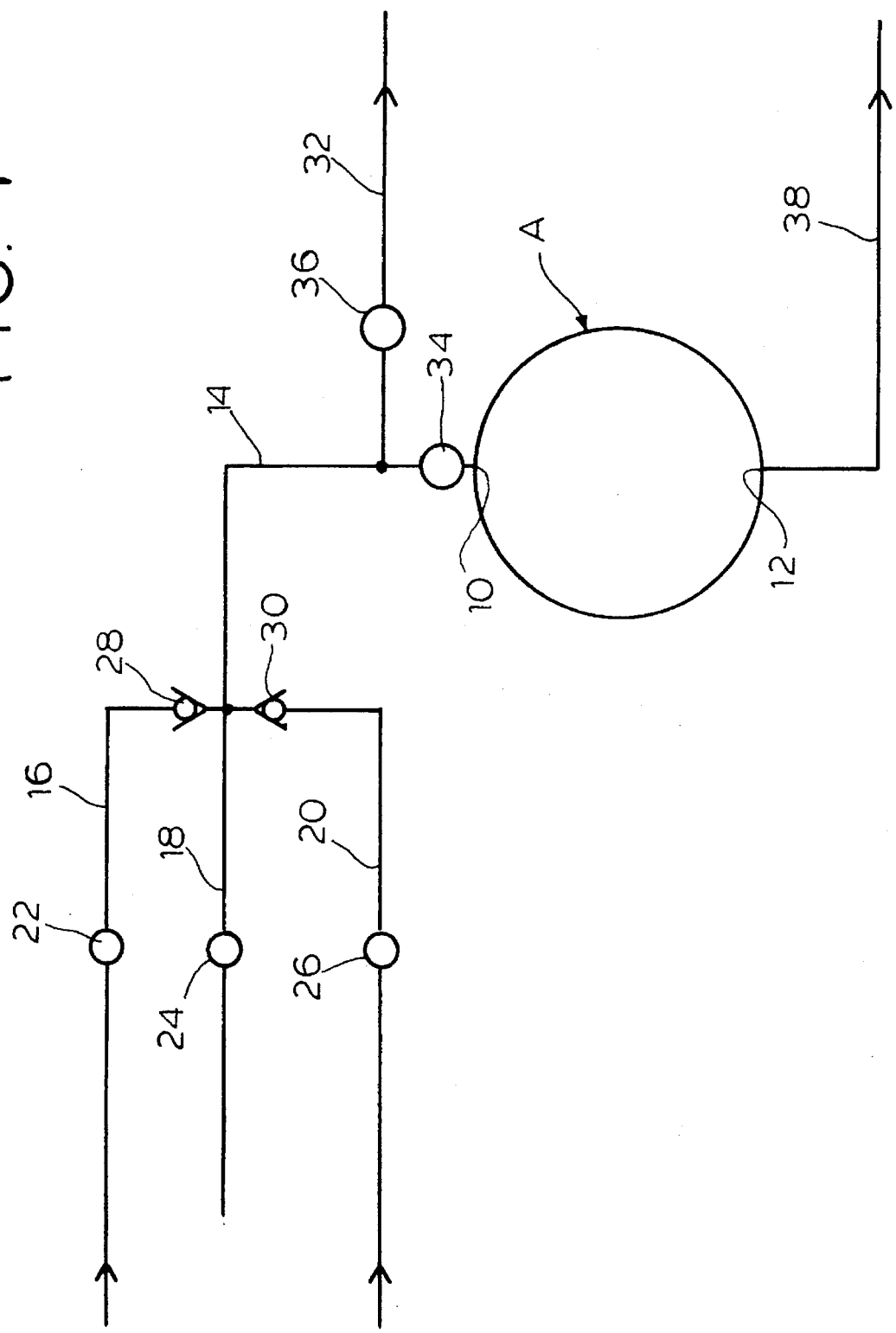

United States Patent [19]

Chan et al.

[11] Patent Number: 5,571,329
[45] Date of Patent: Nov. 5, 1996

[54] GAS FLOW SYSTEM FOR CVD REACTOR

[75] Inventors: Joseph Chan, Kings Park; Dennis Garbis, Huntington Station; John Sapio, Huntington; John Latza, Lindenhurst, all of N.Y.

[73] Assignee: GI Corporation, Hatsboroa, Pa.

[21] Appl. No.: 411,408

[22] Filed: Mar. 28, 1995

Related U.S. Application Data

[62] Division of Ser. No. 15,658, Feb. 9, 1993, abandoned.

[51] Int. Cl.⁶ .................................................. C23C 16/00
[52] U.S. Cl. .................................................. 118/715
[58] Field of Search ........................................... 118/715

[56] References Cited

U.S. PATENT DOCUMENTS

| | | | |
|---|---|---|---|
| 4,284,867 | 8/1981 | Hill et al. ........................... | 118/724 |
| 4,533,410 | 8/1985 | Ogura ................................. | 118/725 |
| 4,615,298 | 10/1986 | Yamazaki ........................... | 118/723 E |
| 4,632,058 | 12/1986 | Dixon et al. ...................... | 118/725 |
| 4,761,269 | 8/1988 | Conger ............................... | 118/715 |
| 4,823,735 | 4/1989 | Pichel et al. ...................... | 118/730 |
| 4,917,136 | 4/1990 | Ohmi .................................. | 137/15 |
| 5,077,875 | 1/1992 | Hoke .................................. | 118/715 |
| 5,123,375 | 6/1992 | Hansen .............................. | 118/715 |
| 5,244,500 | 9/1993 | Ebata ................................. | 118/715 |
| 5,262,356 | 11/1993 | Fujii .................................. | 118/715 |

FOREIGN PATENT DOCUMENTS 1-287277  11/1989  Japan.

OTHER PUBLICATIONS

Patent Abstracts of Japan vol. 4, No. 048.
Patent Abstracts of Japan vol. 13, No. 119.
PT/Electrotechniek Elektronica Oct. 1988.
EPIS Leading Edge, Semiconductor Int., Jun. 1991, pp. 68–71.

*Primary Examiner*—Richard Bueker
*Attorney, Agent, or Firm*—Robert L. Epstein; Harold James; James & Franklin

[57] ABSTRACT

To minimize contamination of gas flow lines and reactor surfaces from high impurity concentrations present in the CVD reactor, control of the dopant gas supply is located closely adjacent to the reactor input port and the dopant gas supply line is separately vented. First and second dopant gas supplies and a diluent gas supply are connected to branch lines which converge to form the dopant supply line. A solenoid valve is situated in the main dopant supply line as close to the input port as possible. A vent line is connected to the dopant supply line, prior to the solenoid valve. The etchant and silicon gas supplies are each connected to the reactor input by a separate supply line. The etchant and silicon gas supply lines are vented separately from the dopant gas supply line.

4 Claims, 2 Drawing Sheets

GAS FLOW SYSTEM FOR CVD REACTOR

This is a divisional of application Ser. No. 08/015,658 filed on Feb. 9, 1993, now abandoned.

The present invention relates to chemical vapor deposition (CVD) reactors and more particularly to a gas flow system for a CVD reactor which minimizes the deleterious residual effect of highly concentrated dopant gas in reactor plumbing system and on reactor chamber surface. By minimizing this deleterious residual effect, the impurity concentration of silicon epitaxial layers can be controlled in consecutive production runs.

Semiconductor devices such as diodes and power transistors are often fabricated on silicon wafers. To form the multiple layers of given resistivity and polarity necessary to obtain the devices, conventional diffusion processes are employed. The silicon wafer is masked and exposed to sources of various impurities level and type at elevated temperature. Thereafter the wafers are diced into individual chips which are connected to terminals and packaged.

The doped layer must be formed in a very precise manner. Otherwise, the physical and electrical properties of the resulting devices will not meet specification. Moreover, the fabrication of quality semiconductor devices must take place at a commercially acceptable yield rate.

Certain silicon wafers for use in making semiconductors are formed by an epitaxial process known as vapor deposition. The silicon layer is grown in a reactor chamber in which precise conditions can be maintained. These chambers are commonly called chemical vapor deposition (CVD) reactors.

In the CVD reactor, supply gases can be utilized in specific amounts and under specified temperatures and pressures to grow silicon layer with precisely controlled properties on a heavily doped silicon substrate. Conventionally, these are single layer epitaxial silicon wafers which must be transferred to a separate chamber called diffusion tube for formation of another doped layer. This is necessary for semiconductor fabrication.

Recently, a new all epitaxial process for growing a multilayer semiconductor structure has been invented. That process is described in as co-pending application Ser. No. 15,384 filed Feb. 9, 1993 and entitled "Multilayer Epitaxial Structure and Method for Fabricating Same", now U.S. Pat. No. 5,324,685, issued Jun. 28, 1994, which is assigned to the assignee of this application. As described in detail in that application, the unique structure includes abrupt profile interfaces, a lightly doped layer and a relatively heavily doped, very low ohmic layer, for example with impurity concentrations in the order of $1 \times 10^{19}$ per cm. The presence of such high impurity concentrations in a CVD reactor normally have adverse affects on subsequent productions runs in the reactor because of the so called residue "memory effect" of the dopant impurities remaining in the gas flow system and reactor chamber surfaces. These residual impurities may prevent precise resistivity control in subsequent processing in the chamber.

The present invention is a gas flow system for use with a CVD reactor which is employed in an epitaxial process where relatively heavy impurity concentrations of dopant impurities are present. The system significantly reduces the residual memory effect of the heavy impurity concentrations, leading to more precise resistivity control in subsequent production runs and thus higher quality wafers, resulting in higher device yields.

The invention accomplishes this objective by modifying conventional CVD reactor gas flow systems to permit control of the supply of dopant source gases at a location in the main dopant gas supply line adjacent to the reactor input port as opposed to conventional CVD system where the gas mixing occurs in the gas control panel. In addition, the dopant gas supply line is separately vented from the other gas supply lines. Flow control devices, such as valves or check valves, etc., are located in the flow lines at places where gases might otherwise mix. Exhaust scrubber conditions are maintained such that adequate pressure conditions exist on all vent, purge and exhaust lines from the reactor in order to minimize or prevent back pressures and contaminations.

It is, therefore, a prime object of the present invention to provide a gas flow system for a CVD reactor which significantly reduces or eliminates the residual memory effect on subsequent production runs due to the presence of heavy impurity concentrations.

It is another object of the present invention to provide a gas flow system for a CVD reactor in which the supply of dopant gases is controlled at a point proximate the reactor input port.

It is another object of the present invention to provide a dopant gas supply system for a CVD reactor which is separately vented from the other gas supply lines.

In accordance with one aspect of the present invention, a gas flow system is provided for a chemical vapor deposition reactor of the type used in growing epitaxial structures having multilayers of high impurity concentrations as well as light impurity concentration. The reactor has a chamber with an input port for receiving gases from first and second gas supplies and an exhaust port. The system comprises first and second gas supply lines connected to said first and second gas supplies, respectively. A vent line is provided. First gas supply line valve means are located in first gas supply line, adjacent to the input port. The vent line is operably connected to the first gas supply line, prior to the valve means. An exhaust line is connected to the output port.

The system also includes check valve means in the first supply line.

Preferably, the first supply line comprises first and second sections. The first gas supply comprises a source of a first dopant gas and a source of a second dopant gas. The first section is connected to the first dopant gas source. The second section is connected to the second dopant gas source.

First section valve means are located in the first section. Second section valve means are located in the second section.

The system also includes first and second check valve means in the first and second sections, respectively. The second gas source comprises a source of diluent gas.

The first supply line valve means comprises a solenoid valve. The first and second section valve means are located in the second section.

The system also includes first and second check valve means in the first and second sections, respectively. The second gas source comprises a source of diluent gas.

The first supply line valve means comprises a solenoid valve. The first and second section valve means also comprise solenoid valves.

In accordance with another aspect of the present invention, a gas flow system is provided for a chemical vapor deposition reactor of the type used in growing epitaxial structures having multilayers of high impurity concentrations, as well as light impurity concentrations. The reactor has a reactor chamber with a gas input port adapted to receive input gases from first, second and third input gas supplies, respectively, and an output port. The system includes first, second and third branch lines operably connected to the first, second and third gas sources respectively. Each of the first, second and third branch lines also include a gas vent section. The gas vent section of the first branch is separate from the other vent sections. The gas input sections are operably connected to the chamber input port. An exhaust line is operably connected to the chamber output port.

The first branch line comprises valve means. The valve means is situated adjacent to the input port.

The first input gas supply may be, for example, a source of dopant, the second input gas supply, a source of etchant and the third input gas supply may be a source of silicon. The first input gas supply preferably includes a first source of dopant gas and a second source of dopant gas. The first branch line preferably includes a first gas source section and a second gas source section. Each of the first and second gas source sections comprise valve means.

Figure 2:
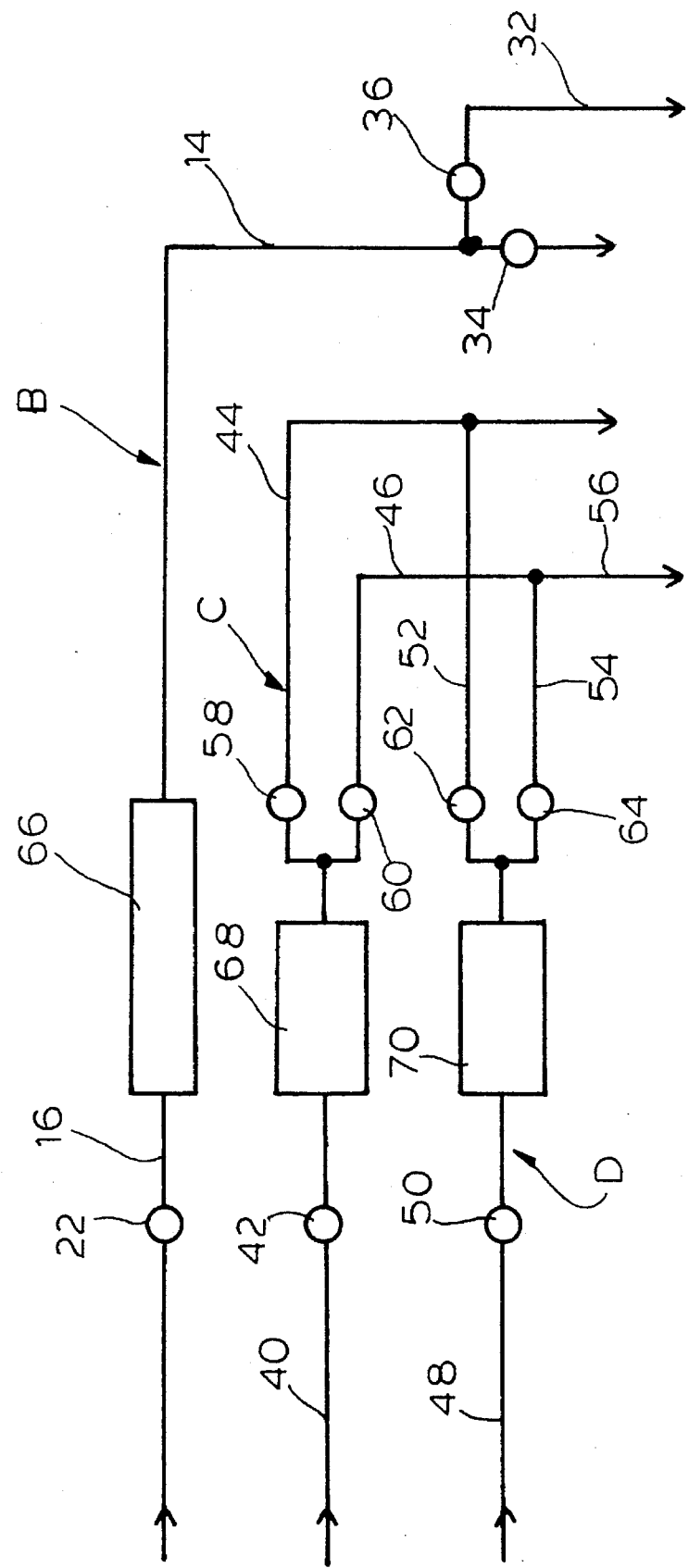

To these and such other objects which may hereinafter appear, the present invention relates to a gas flow system for a CVD reactor, as described in the following specification and recited in the annexed claims, taken together with the accompanying drawings, wherein like numerals refer to like parts in which:

FIG. 1 is a schematic diagram illustrating the dopant supply control aspect of the present invention; and FIG. 2 is a schematic diagram illustrating the separate venting aspect of the present inventions.

As seen in FIG. 1, the CVD reactor chamber, generally designated A, is provided with an input port 10 and an exhaust port 12, as is conventional. Input port 10 is connected to the dopant supply portion of the gas flow system which includes a main dopant gas supply line 14. Main supply line 14 in turn is fed by three branch supply lines 16, 18, 20. Branch lines 16 and 20, in the example are each connected to a different source of an impurity dopant gas, respectively, such as sources of gases containing boron or phosphorous. Branch line 18 is connected to receive a diluent gas, such as hydrogen, which may be mixed with the dopant gases prior to entering Chamber A or may be used as a purge.

Each branch supply line 16, 18 and 20 contains a solenoid valve 22, 24, and 26 respectively, which controls gas flow therein by opening and closing in response to the application of the appropriate electric signal. Further, check valves 28, 30 and situated in lines 16 and 20, respectively. The check valves are located proximate the point where the branch supply lines converge to form main dopant supply gas line 14.

Main dopant gas supply line 14 is connected to a vent line 32 which serves to vent all of the dopant gas supply lines. Vent line 32 is connected to main supply line 14 close to a solenoid valve 34 which controls the flow from the main supply line into input port 10. Valve 34 is located in main supply line 14 adjacent to input port 10. A solenoid valve 36 is also present in vent line 32. This configuration permits the entire supply line system to be thoroughly purged when required.

The exhaust portion of the gas flow system includes an exhaust line 38. Exhaust line 38 is connected to reactor output port 12.

FIG. 2 illustrates the overall gas flow system. The dopant supply portion, generally designated B, is preferably as structured as illustrated in FIG. 1. However, for simplicity, the dopant gas supply is here illustrated as a single supply line 16. The etchant gas supply portion is generally designated C. The silicon source gas supply portion is generally designated D.

Etchant supply portion C includes a supply line 40 with a solenoid valve 42. Supply line 40 splits into a feed line 44 and a vent line 46. Similarly, silicon source gas supply portion D includes a supply line 43 with a solenoid valve 50. Line 48 splits into a feed line 52 and a vent line 54. Feed lines 44 and 52 are connected to the input port 10 of the reactor. Vent lines 46, 54 may be connected for form a common vent line 56. However, vent line 56 is separate from the dopant gas supply vent line 32.

Solenoid valves 58 and 60 are situated in lines 44 and 46 respectively. Solenoid valves 62 and 64 are situated in lines 52 and 54 respectively. Flow rate control devices 66, 68 and 70 of conventional design are situated in lines 16, 42 and 50 of each gas supply portion B, C and D, respectively, such that the rate of gas flow through each portion can be regulated precisely.

It will now be appreciated that the present invention is a gas flow system for a CVD reactor in which the control valve for the dopant gas supply is located adjacent to the reactor chamber input port. Moreover, a separate vent line is provided for the dopant supply, the other gas supply lines having a different vent. Valves are strategically located to prevent gases from mixing. By appropriately pressurizing the system, this configuration minimizes back pressure and contaminations.

While only one preferred embodiment of each aspect of the present invention have been disclosed for purposes of illustration, many variations and modifications could be made thereto. It is intended to cover all of these modifications and variations which fall within the scope of the invention, as defined by the following claims:

We claim:

1. A gas flow system for a chemical vapor deposition reactor of the type adapted for use in growing epitaxial structures, the reactor having a reactor chamber with an input port and an output port, the system comprising a main dopant gas supply line connected to said input port, main dopant supply value means in said main dopant gas supply line adjacent said input port, a main dopant gas supply vent line connected to said main dopant gas supply line at a point proximate said main dopant gas supply valve means, first, second and third branch dopant gas supply lines connected to feed said main dopant gas supply line, each of said branch dopant gas supply lines having a branch dopant gas supply valve means, an etchant gas supply line connected to said input port, etchant gas supply line valve means in said etchant gas supply line, an etchant gas supply vent line connected to said etchant gas supply line, a silicon gas supply line connected to said input port, silicon gas supply line valve means in said silicon gas supply line, a silicon gas supply vent line connected to said silicon gas supply line, said etchant gas supply vent line and said silicon gas supply vent line forming a common vent line separate from said main dopant gas vent line.

2. The gas flow system of claim 1 further comprising main dopant gas supply vent line valve means in said main dopant gas supply vent line.

3. The gas flow system of claim 1 further comprising etchant gas supply line valve means in said etchant gas supply line.

4. The gas flow system of claim 1 further comprising silicon gas supply line valve means in said silicon gas supply line.

* * * * *